United States Patent
Sim et al.

(10) Patent No.: US 7,595,145 B2
(45) Date of Patent: Sep. 29, 2009

(54) METHOD OF FORMING PATTERN OF SEMICONDUCTOR DEVICE

(75) Inventors: Guee Hwang Sim, Gangneung-si (KR); Woo Yung Jung, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 181 days.

(21) Appl. No.: 11/614,083

(22) Filed: Dec. 21, 2006

(65) Prior Publication Data
US 2008/0081297 A1    Apr. 3, 2008

(30) Foreign Application Priority Data
Sep. 29, 2006    (KR) ............... 2006-96214

(51) Int. Cl.
*G03F 7/26*    (2006.01)
(52) U.S. Cl. ..................... 430/313; 430/311
(58) Field of Classification Search ........... 430/311, 430/322, 313
See application file for complete search history.

(56) References Cited

U.S. PATENT DOCUMENTS 6,165,692 A * 12/2000 Kanai et al. ............. 430/311

2005/0106870 A1 * 5/2005 Cheng ..................... 438/689

FOREIGN PATENT DOCUMENTS

| CN | 1619774 | 5/2005 |
| KR | 10-1996-0014056 B1 | 10/1996 |
| KR | 10-2005-0066933 A | 6/2005 |

* cited by examiner

*Primary Examiner*—Kathleen Duda
*Assistant Examiner*—Brittany Raymond
(74) *Attorney, Agent, or Firm*—Townsend and Townsend and Crew LLP

(57) ABSTRACT

A method of forming a pattern of a semiconductor device includes forming a hard mask layer over a semiconductor substrate and forming a photoresist film pattern over the hard mask layer. An outer portion of the photoresist film pattern is converted into an oxide layer having a first vertical wall, a second vertical wall, and a horizontal wall, wherein an inner portion of the photoresist film pattern is enclosed within the converted oxide layer. At least a portion of the horizontal wall is removed to expose the photoresist film pattern remaining within the converted oxide layer. The exposed photoresist film pattern is removed to form first and second oxide patterns corresponding to the first and second vertical walls, respectively, of the oxide layer. The hard mask layer is patterned using the first and second oxide patterns as etch masks. The semiconductor substrate is etched using the patterned hard mask layer.

20 Claims, 7 Drawing Sheets

METHOD OF FORMING PATTERN OF SEMICONDUCTOR DEVICE

CROSS-REFERENCES TO RELATED APPLICATIONS

The present application claims priority to Korean patent application number 10-2006-096214, filed on Sep. 29, 2006, which is incorporated by reference in its entirety.

BACKGROUND OF THE INVENTION

The present invention relates to a method of forming a mask pattern for a semiconductor device, and more particularly, to a method of forming a micro pattern.

In general, a semiconductor device, such as flash memory, includes thousands of micro patterns. The micro patterns are formed by means of a photolithography process. In order to form the micro patterns using the photolithography process, a photoresist is first coated on a subject film to be patterned. A common exposure process is then performed using a mask to change the solubility of the exposed photoresist film. A development process is performed to remove the portions whose solubility has been changed or not changed, thus forming a photoresist film pattern. An etch process using the photoresist film pattern as an etch mask is performed to remove the exposed portion of the subject film. The photoresist film pattern is stripped to form a subject film pattern.

In the photolithography process, two important issues are resolution and depth of focus (DOF). In the case of resolution of the exposure equipment, the shorter the wavelength of the light source and the larger the aperture setting (i.e., smaller opening), the higher the resolution. Accordingly, a greater number of micro patterns can be formed on the wafer. However, the wavelength of the light source and the aperture setting of the exposure equipment are limited, whereas the level of device integration continues to rapidly increase. A resolution enhancement technique (RET) for improving the resolution and the DOF by using several methods has been developed. The RET includes a double exposure technique (DET), a top-surface imaging process by silylation (TIPS) and the like.

The DET is a process by which the exposure and etch process are performed twice. The DET is advantageous in that it can form relatively micro patterns, but is disadvantageous in that overlay margin is weak and it is difficult to uniformly control the Critical Dimension (CD) between patterns.

The TIPS (top-surface imaging process by silylation) process is a process of performing shallow exposure so that diffusion reaction is selectively performed on exposed regions and non-exposed regions in order to form a latent image, and enabling silylation regions to serve as a mask and non-silylation regions to be developed. The TIPS process is advantageous compared with a general resist patterning process in that it has a very wide DOF compared with a single film resist in high resolutions, but is disadvantageous in that it has limitations in applying it to the next generation of even smaller micro patterns.

BRIEF SUMMARY OF THE INVENTION

Embodiments of the present invention are directed to the formation of micro patterns in such a manner that sides and top surface of photoresist film patterns are silylated, the top surface of the photoresist film patterns and central portions of the photoresist film patterns, which have not been silylated, are removed, so that the sides of the photoresist film pattern become the new pattern. This would be analogous to building a solid wall then hollowing out the center to form two parallel walls.

A method of forming a pattern of a semiconductor device according to an embodiment of the present invention includes the steps of; forming hard masks over a semiconductor substrate; forming photoresist film patterns over the hard masks; changing the top and side surfaces of the photoresist film patterns into oxide layers; removing the oxide layers over the photoresist film patterns, thus exposing photoresist films within the photoresist film patterns; removing the exposed photoresist films to form oxide layer patterns; and etching the hard masks using the oxide layer patterns as etch masks.

A method of forming a pattern of a semiconductor device according to another embodiment of the present invention includes the steps of; forming hard masks over a semiconductor substrate in which a cell region and a peripheral region are partitioned; forming photoresist film patterns over the hard masks; changing the top and side surfaces of the photoresist film patterns into oxide layers; cutting the oxide layers of the peripheral region; removing the oxide layers over the photoresist film patterns, thus exposing photoresist films within the photoresist film patterns; removing the exposed photoresist films to form oxide layer patterns; and etching the hard masks using the oxide layer patterns as etch masks.

The step of forming the oxide layers may include the steps of coating a silylation reagent on the photoresist film patterns, and performing an exposure or baking process, or performing the exposure and baking processes at the same time, thus changing the top and side surfaces of the photoresist film patterns into the oxide layers.

The oxide layers may be made of $SiO_2$.

Each of the photoresist film patterns may have a width, which is twice that of each of the oxide layer patterns.

A thickness in which the surfaces of the photoresist film patterns are deformed into the oxide layers may be the same as that of each of the oxide layer patterns.

The silylation reagent may be formed from one of groups consisting of hexamethyl disilazane (HMDS), tetramethyl disilazane (TMDS), bisdimethyl amino methylsilane (BD-MAMS), bisdimethyl amino dimethylsilane, dimethylsilyl dimethylamine, dimethylsilyl diethylamine, trimethylsilyl diethylamine and dimethyl amino pentamethylsilane.

A method of forming a pattern of a semiconductor device according to still another embodiment of the present invention includes the steps of; providing a semiconductor substrate in which a target subject to be patterned is formed; forming photoresist film patterns, each of which has a pitch larger than that of the target subject to be patterned over the target subject; changing all surfaces of the photoresist film patterns into oxide layers; removing the oxide layers formed over the photoresist film patterns, thus exposing photoresist films within the photoresist film patterns; removing the exposed photoresist films to form oxide layer patterns, each of which has a pitch smaller than that of each of the photoresist film patterns; and etching the target subject using the oxide layer patterns as etch masks.

A method of forming a pattern of a semiconductor device according to still another embodiment of the present invention includes the steps of; forming a to-be-etched layer over a semiconductor substrate; forming photoresist film patterns over the to-be-etched layer; changing the surfaces of the photoresist film patterns into mask layers having an etch selectivity different from that of the to-be-etched layer; removing the mask layers over the photoresist film patterns, thus exposing photoresist films within the photoresist film patterns; removing the exposed photoresist films to form mask layer patterns; and etching the to-be-etched layer using the mask layer patterns as etch masks.

In one embodiment, a method of forming a pattern of a semiconductor device includes forming a hard mask layer over a semiconductor substrate and forming a photoresist film pattern over the hard mask layer. An outer portion of the photoresist film pattern is converted into an oxide layer having a first vertical wall, a second vertical wall, and a horizontal wall, wherein an inner portion of the photoresist film pattern is enclosed within the converted oxide layer. At least a portion of the horizontal wall is removed to expose the photoresist film pattern remaining within the converted oxide layer. The exposed photoresist film pattern is removed to form first and second oxide patterns corresponding to the first and second vertical walls, respectively, of the oxide layer. The hard mask layer is patterned using the first and second oxide patterns as etch masks. The semiconductor substrate is etched using the patterned hard mask layer.

In another embodiment, a method of forming a pattern of a semiconductor device includes forming a hard mask layer over a semiconductor substrate and forming a photoresist pattern over the hard mask layer. An outer portion of the photoresist pattern is converted into a layer of different material, the converted layer having first, second, and third portions that together enclose an inner portion of the photoresist pattern, the first and second portions extending vertically and the third portion extending horizontally. The third portion of the converted layer is removed to expose the photoresist pattern remaining within the converted layer. The exposed photoresist pattern is removed to obtain first and second patterns corresponding to the first and second portions, respectively, of the converted layer. The hard mask layer is patterned using the first and second patterns.

In another embodiment, a method of forming a pattern of a semiconductor device includes providing a semiconductor substrate having a target layer; forming a photoresist pattern having a pitch; converting an outer portion of the photoresist pattern into an oxide layer; removing a portion of the oxide layer to expose the photoresist pattern remaining within the converted oxide layer; removing the remaining photoresist pattern to form first and second patterns, each having a pitch that is smaller than the pitch of the photoresist pattern; and etching the target layer using the first and second patterns as etch masks.

In yet another embodiment, a method of forming a pattern on a substrate includes forming a mask layer over a semiconductor substrate; forming a first pattern over the mask layer, the first pattern being of first material; converting an outer portion of the first pattern into a layer of second material, the converted layer having first, second, and third portions that together enclose an inner portion of the first pattern of the first material, the first and second portions extending vertically and the third portion extending horizontally; removing the third portion of the converted layer to expose an inner portion of the first pattern remaining within the converted layer; removing the exposed inner portion of the first pattern to obtain second and third patterns of the second material; and patterning the mask layer using the second and third patterns. The second and third patterns correspond to the first and second portions, respectively, of the converted layer. The first material includes photoresist. The second material includes oxide, wherein the second and third patterns together comprises a pattern.

BRIEF DESCRIPTION OF THE DRAWINGS

FIGS. 1A to 7A are cross-sectional views showing a cell region, sequentially shown to illustrate a method of forming a pattern of a semiconductor device according to an embodiment of the present invention; and FIGS. 1B to 7B are perspective views showing a connection of a peripheral region, sequentially shown to illustrate a method of forming a pattern of a semiconductor device according to an embodiment of the present invention.

DESCRIPTION OF SPECIFIC EMBODIMENTS

FIGS. 1A to 7A are cross-sectional views showing a cell region, sequentially shown to illustrate a method of forming a pattern of a semiconductor device according to an embodiment of the present invention. FIGS. 1B to 7B are perspective views showing a connection of a peripheral region, sequentially shown to illustrate a method of forming a pattern of a semiconductor device according to an embodiment of the present invention.

Figure 1A:
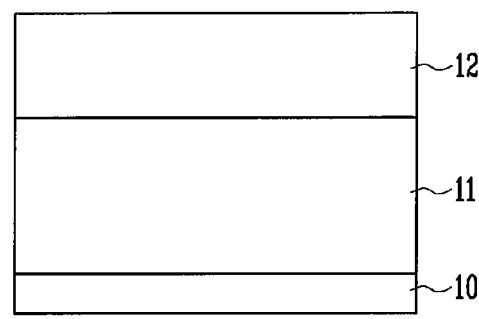
Figure 1B:
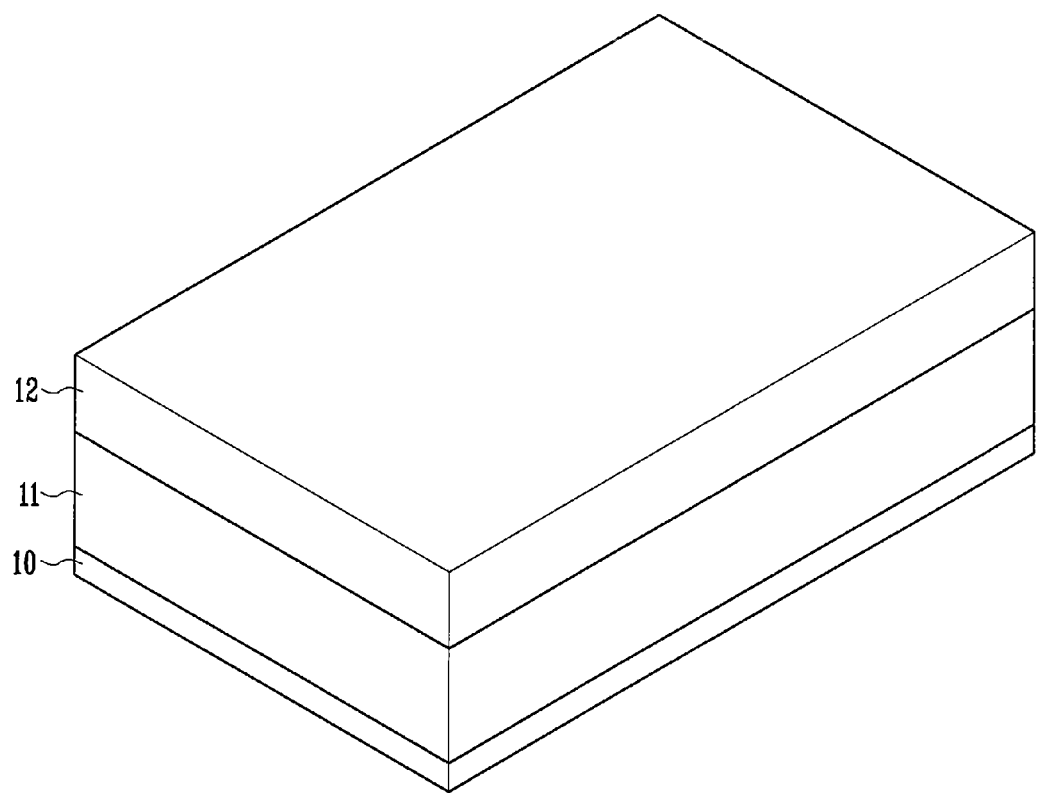

Referring to FIGS. 1A and 1B, hard mask 11 is formed over a semiconductor substrate 10 of a cell region and of a peripheral region, respectively. Photoresist film 12 is formed over the hard mask 11, respectively.

The hard mask 11 may be formed using poly (i.e., methyl methacrylate), polymer, novolacs, sulfone polymer or the like. The photoresist film 12 may be formed using a chemical amplification type sensitizer.

Figure 2A:
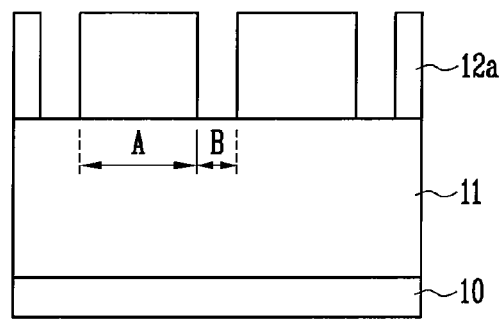
Figure 2B:
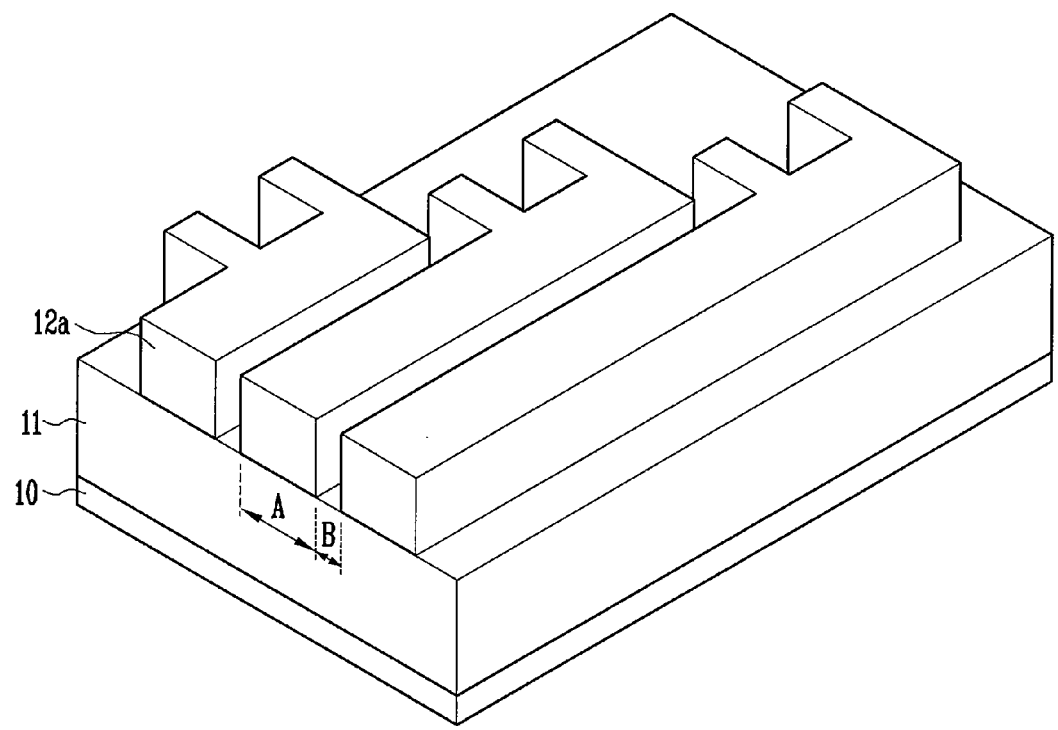

Referring to FIGS. 2A and 2B, photoresist film pattern 12a is formed by performing an etch process using a mask (not shown) on the photoresist film 12 (refer to FIGS. 1A and 1B). The etch process may be performed using KrF, ArF, F2 or EUV light source.

Assuming that the sum of the width A of the photoresist film pattern 12a and the distance B of the photoresist film pattern 12a is the pitch of the photoresist film pattern 12a, the photoresist film pattern 12a is formed in such a manner that the pitch of the photoresist film pattern 12a is twice the pitch that is finally formed. Alternatively, the width A of the photoresist film pattern 12a may be three times the distance B of the photoresist film pattern 12a. However, the present invention is not limited to the above, the width A of the photoresist film pattern 12a and the distance B of the photoresist film pattern 12a may be changed by taking into consideration the final size of the pattern to be formed.

Figure 3A:
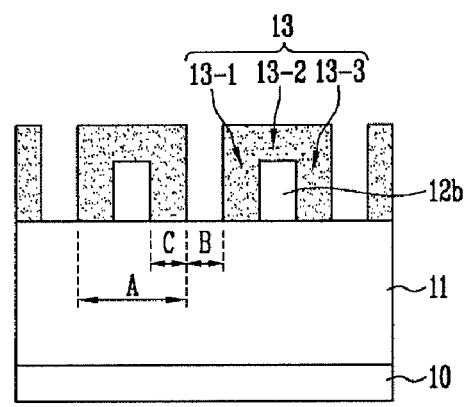
Figure 3B:
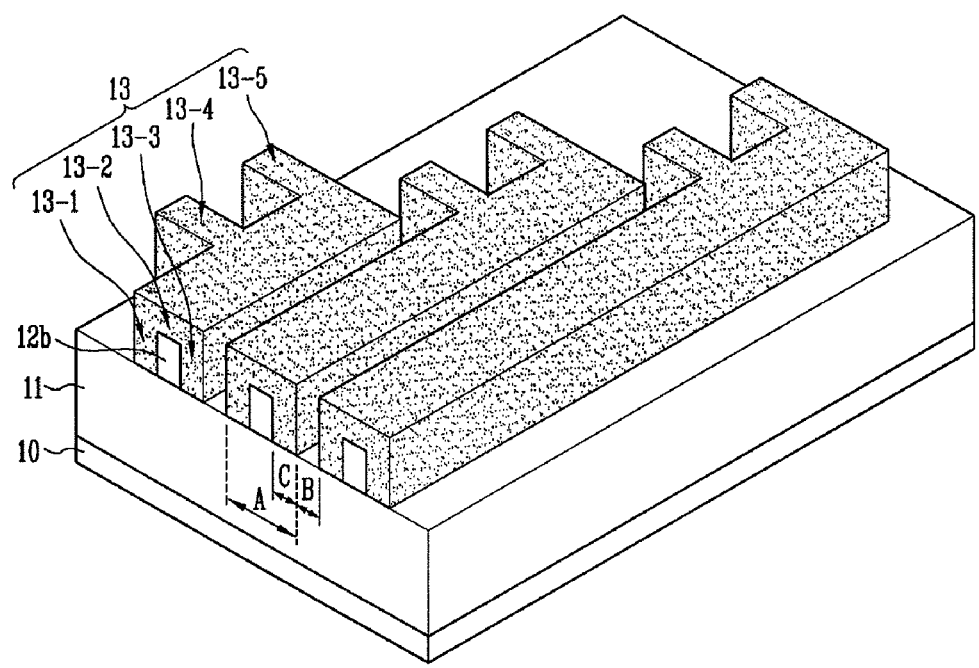

Referring to FIGS. 3A and 3B, a silylation reagent including silicon is coated on the photoresist film pattern 12a (refer to FIGS. 2A and 2B), thus silylating the sides and top surface of the photoresist film pattern 12a. Exposure or baking is performed in separate steps, or exposure and baking are performed simultaneously on the photoresist film pattern 12a whose surfaces have been silylated, thereby changing the sides and top surface of the photoresist film pattern 12a into oxide layer 13. The oxide layer 13 may be $SiO_2$. Meanwhile, a photoresist film 12b, which is the remaining part of the unchanged photoresist film pattern 12a, remains at the center of the oxide layer 13. The oxide layer 13 has a first vertical wall 13-1, a second vertical wall 13-3, a horizontal wall 13-2, a first peripheral pattern 13-4 and a second peripheral pattern 13-5. The peripheral first pattern 13-4 is connected to the first vertical wall 13-1 in the peripheral region, and the second peripheral pattern 13-5 is connected to the first and second vertical walls 13-1 and 13-3 in the peripheral region.

The formed thickness of the oxide layer 13 may be changed by adjusting temperature and time of the exposure or baking process. The thickness C of the oxide layer 13 is chosen to have the same thickness as the thickness of the target pattern. Alternatively, the thickness C of the oxide layer 13 may be identical to the distance B of the oxide layer 13.

The silylation reagent may be used as a liquid phase or a gas phase, and may contain 3 to 70% silicon. The silylation reagent may use one of the following; hexamethyl disilazane (HMDS), tetramethyl disilazane (TMDS), bisdimethyl amino methylsilane (BDMAMS), bisdimethyl amino dimethylsilane, dimethylsilyl dimethylamine, dimethylsilyl diethylamine, trimethylsilyl diethylamine or dimethyl amino pentamethylsilane.

Figure 4A:
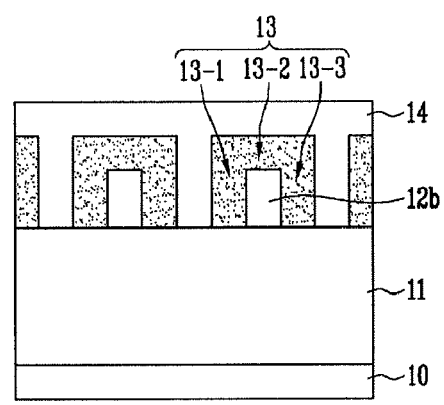
Figure 4B:
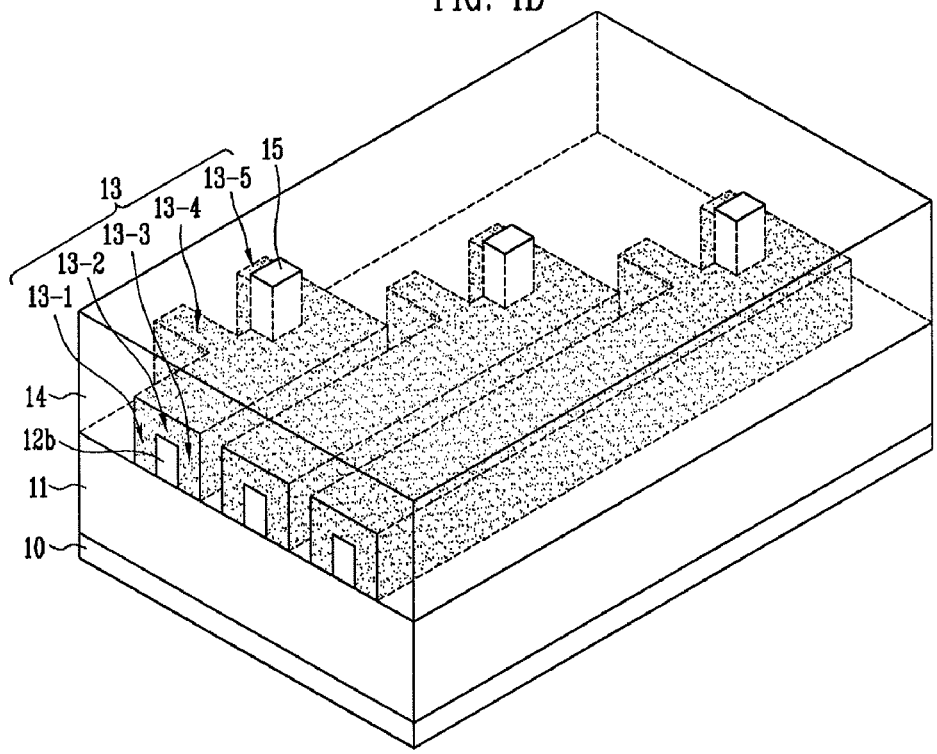

Referring to FIGS. 4A and 4B, photoresist 14 is formed over the entire surface of the hard mask 11. Etch hole 15 is formed so that a portion of the first vertical wall 13-1 between the first peripheral pattern 13-4 and the second peripheral pattern 13-5, formed in the semiconductor substrate 10 of the peripheral region, is exposed. Exposure and development processes are performed through the etch hole 15, thus cutting the portion of the first vertical wall 13-1 of the oxide layer 13. Accordingly, connectors of the peripheral region formed in a subsequent process can be separated from each other.

Figure 5A:
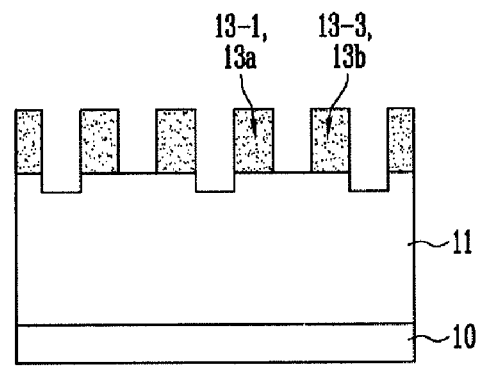
Figure 5B:
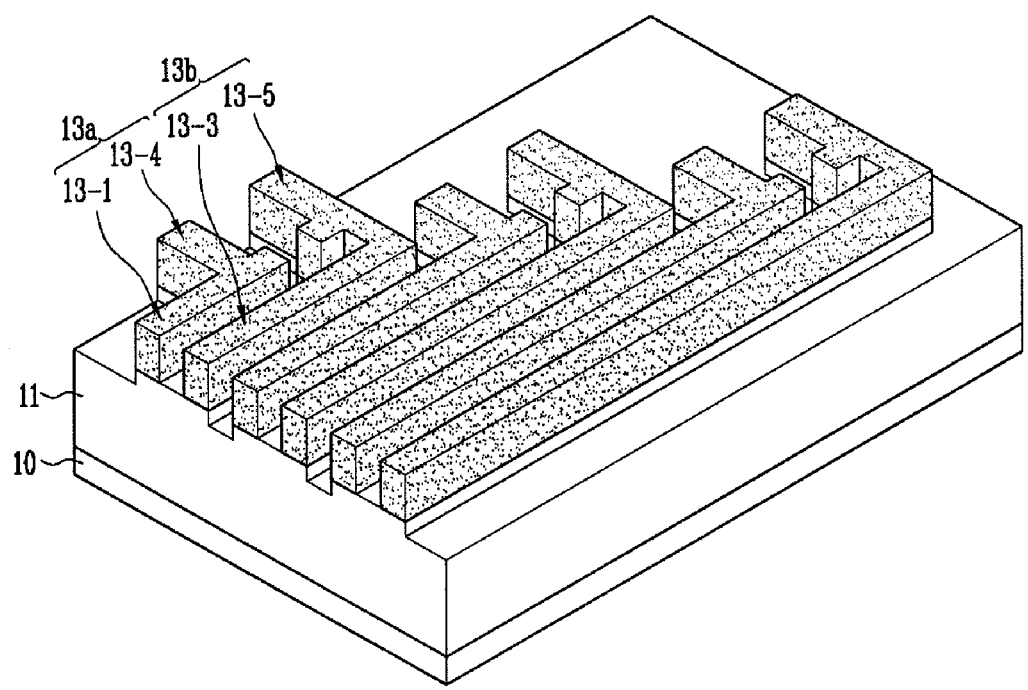

Referring to FIGS. 5A and 5B, the photoresist 14 (refer to FIGS. 4A and 4B) is removed. The horizontal wall 13-2 of the oxide layer 13 (refer to FIGS. 4A and 4B) is removed through an anisotropic etch process so that the remaining photoresist film 12b (refer to FIGS. 4A and 4B) is exposed, thereby separating the first peripheral pattern 13-4 and the second peripheral pattern 13-5 in the peripheral region and separating the first vertical wall 13-1 and the second vertical wall 13-3 in the cell region. Thus, the first peripheral pattern 13-4 of the peripheral region and the first vertical wall 13-1 of the cell region are connected by a single body, and the second peripheral pattern 13-5 of the peripheral region and the second vertical wall 13-3 of the cell region are connected by a single body. The anisotropic etch process may be a dry etch process. The remaining photoresist film 12b is removed using a well-known technique, thus forming a first oxide layer pattern 13a and a second oxide layer pattern 13b. Accordingly, the width of the first and second oxide layer patterns 13a and 13b in the cell region become half that of the photoresist film pattern 12a (refer to FIGS. 2A and 2B), thereby forming even smaller micro patterns in the cell region. Here, the first oxide layer pattern 13a corresponds to the first vertical wall 13-1 and the first peripheral pattern 13-4, and the second oxide layer pattern 13b corresponds to the second vertical wall 13-3 and the second peripheral pattern 13-5.

Figure 6A:
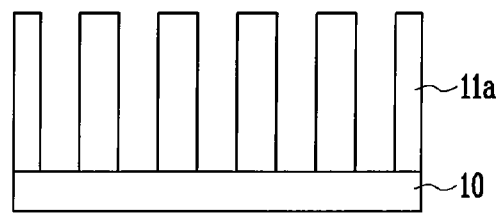
Figure 6B:
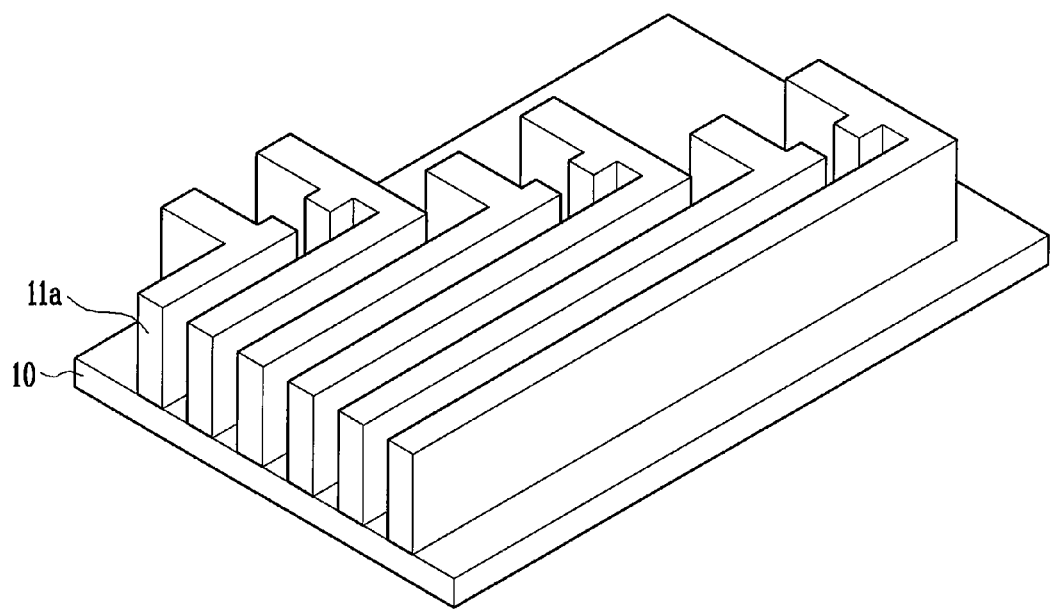

Referring to FIGS. 6A and 6B, an anisotropic etch process using the first and second oxide layer patterns 13a and 13b (refer to FIGS. 5A and 5B) as etch masks is performed to form hard mask pattern 11a. In other words, the first and second oxide layer patterns 13a and 13b are used as hard masks for forming the underlying hard mask pattern 11a. The first and second oxide layer patterns 13a and 13b are removed using a well-known technique.

Figure 7A:
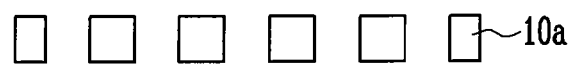
Figure 7B:
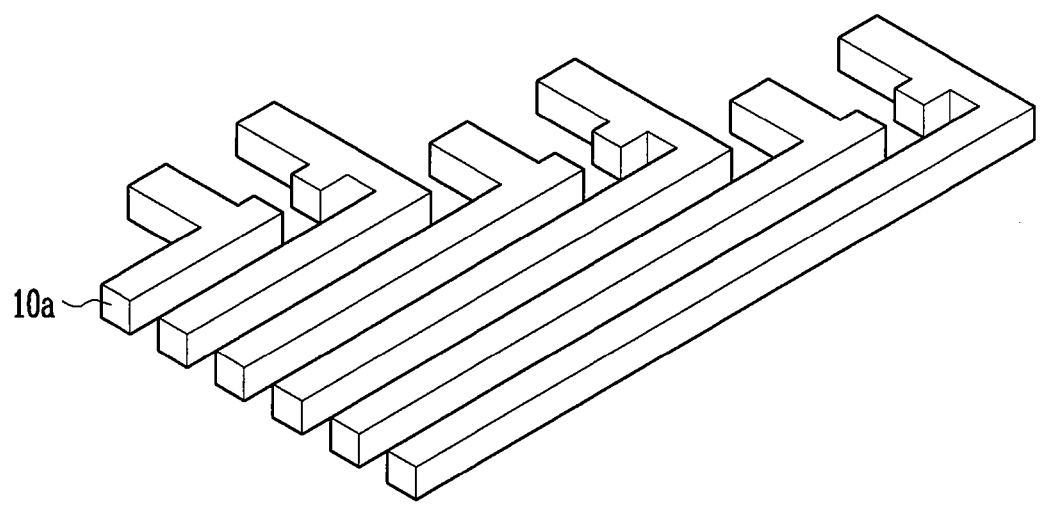

Referring to FIGS. 7A and 7B, an etch process using the hard mask pattern 11a (refer to FIGS. 6A and 6B) as etch masks is performed to form semiconductor substrate pattern 10a. The hard mask pattern 11a is removed using a well-known technique.

In accordance with the method of forming a pattern of a semiconductor device according to the present invention, the surfaces of photoresists are changed to oxide layers. Patterns are formed using the oxide layers formed on the sides of the photoresist patterns. Accordingly, even smaller micro patterns can be formed. This enables higher-integration and smaller micro devices to be formed.

While the present invention has been described with reference to the particular illustrative embodiments, it is to be appreciated that those skilled in the art can change or modify the embodiments without departing from the scope and spirit of the present invention and appended claims. For example, in the present embodiment, it has been described that the method is applied to form the connector patterns in the peripheral region. However, it would be evident to those skilled in the art that the method may be applied to form independently formed patterns.

What is claimed is:

1. A method of forming a pattern of a semiconductor device, the method comprising:
   forming a hard mask layer over a semiconductor substrate including a cell region and a peripheral region;
   forming a photoresist film pattern over the hard mask layer;
   converting an outer portion of the photoresist film pattern into an oxide layer having a first vertical wall, a second vertical wall, a horizontal wall, a first peripheral pattern and a second peripheral pattern, wherein an inner portion of the photoresist film pattern is enclosed within the converted oxide layer, the peripheral first pattern is connected to the first vertical wall in the peripheral region, and the second peripheral pattern is connected to the first and second vertical walls in the peripheral region;
   removing a portion of the first vertical wall between the first peripheral pattern and the second peripheral pattern in the peripheral region;
   removing at least a portion of the horizontal wall in the cell region and the peripheral region to expose the photoresist film pattern remaining within the converted oxide layer, thereby separating the first peripheral pattern and the second peripheral pattern in the peripheral region and separating the first vertical wall and the second vertical wall in the cell region, wherein the first peripheral pattern of the peripheral region and the first vertical wall of the cell region are connected by a single body, and the second peripheral pattern of the peripheral region and the second vertical wall of the cell region are connected by a single body;
   removing the exposed photoresist film pattern to form a first oxide pattern corresponding to the first vertical wall and the first peripheral pattern, and to form a second oxide pattern corresponding to the second vertical wall and the second peripheral pattern;
   patterning the hard mask layer using the first and second oxide patterns as etch masks; and
   etching the semiconductor substrate using the patterned hard mask layer.

2. The method of claim 1, wherein the converting step comprises:
   coating a silylation reagent on the photoresist film pattern; and
   thermally treating the coated photoresist film pattern.

3. The method of claim 2, wherein the silylation reagent includes at least one selected from the group consisting of hexamethyl disilazane (HMDS), tetramethyl disilazane (TMDS), bisdimethyl amino methylsilane (BDMAMS), bisdimethyl amino dimethylsilane, dimethylsilyl dimethylamine, dimethylsilyl diethylamine, trimethylsilyl diethylamine and dimethyl amino pentamethylsilane.

4. The method of claim 1, wherein the oxide layer includes $SiO_2$.

5. The method of claim 1, wherein the removing-at-least-a-portion-of-the-horizontal-wall step involves an etch back step.

6. The method of claim 1, wherein the removing-at-least-a-portion-of-the-horizontal-wall step involves a chemical mechanical polishing step.

7. A method of forming a pattern of a semiconductor device, the comprising:
   forming a hard mask layer over a semiconductor substrate including a cell region and a peripheral region;
   forming a photoresist pattern over the hard mask layer;
   converting an outer portion of the photoresist pattern into a layer of different material, the converted layer having first, second, third, fourth and fifth portions that together enclose an inner portion of the photoresist pattern, the first and second portions extending vertically and the third portion extending horizontally, wherein the fourth portion is connected to the first portion in the peripheral region, and the fifth portion is connected to the first and second portions in the peripheral region;

removing a portion of the first portion of the converted layer between the fourth portion and the fifth portion in the peripheral region;

removing the third portion of the converted layer in the cell region and the peripheral region to expose the photoresist pattern remaining within the converted layer, thereby separating the fourth portion and the fifth portion in the peripheral region and separating the first portion and the second portion in the cell region, wherein the fourth portion of the peripheral region and the first portion of the cell region are connected by a single body and the fifth portion of the peripheral region and the second portion of the cell region are connected by a single body;

removing the exposed photoresist pattern to obtain a first pattern corresponding to the first and fourth portions, and to obtain a second pattern corresponding to the second and fifth portions; and patterning the hard mask layer using the first and second patterns.

8. The method of claim 7, wherein the converting step comprises:
coating a silylation reagent on the photoresist pattern; and
baking the coated photoresist pattern.

9. The method of claim 8, wherein the silylation reagent includes at least one selected from groups consisting of hexamethyl disilazane (HMDS), tetramethyl disilazane (TMDS), bisdimethyl amino methylsilane (BDMAMS), bisdimethyl amino dimethylsilane, dimethylsilyl dimethylamine, dimethylsilyl diethylamine, trimethylsilyl diethylamine and dimethyl amino pentamethylsilane.

10. The method of claim 7, wherein the converted layer is an oxide including $SiO_2$.

11. The method of claim 7, further comprising etching the substrate using the patterned hard mask layer.

12. The method of claim 7, wherein the hard mask layer includes nitride.

13. A method of forming a pattern of a semiconductor device, the method comprising:
providing a semiconductor substrate including a cell region and a peripheral region having a target layer;
forming a photoresist pattern having a pitch;
converting an outer portion of the photoresist pattern into an oxide layer having a first vertical portion, a second vertical portion, a horizontal portion, a first peripheral pattern and a second peripheral pattern, wherein an inner portion of the photoresist film pattern is enclosed within the converted oxide layer, the peripheral first pattern is connected to the first vertical portion in the peripheral region, and the second peripheral pattern is connected to the first and second vertical portions in the peripheral region;
removing the first vertical portion of the converted oxide layer between the first peripheral pattern and the second peripheral pattern in the peripheral region;
removing a horizontal portion of the converted oxide layer in the cell region and the peripheral region to expose the photoresist pattern remaining within the converted oxide layer, thereby separating the first peripheral pattern and the second peripheral pattern in the peripheral region and separating the first vertical portion and the second vertical portion in the cell region, wherein the first peripheral pattern of the peripheral region and the first vertical portion of the cell region are connected by a single body, and the second peripheral pattern of the peripheral region and the second vertical portion of the cell region are connected by a single body;

removing the remaining photoresist pattern to form first and second patterns, each having a pitch that is smaller than the pitch of the photoresist pattern; and etching the target layer using the first and second patterns as etch masks.

14. The method of claim 13, wherein the oxide layer includes $SiO_2$.

15. A method of forming a pattern on a substrate, the method comprising:
forming a mask layer over a semiconductor substrate including a cell region and a peripheral region;
forming a first pattern over the mask layer, the first pattern being of first material;
converting an outer portion of the first pattern into a layer of second material, the converted layer having first, second, third, fourth and fifth portions that together enclose an inner portion of the first pattern of the first material, the first and second portions extending vertically and the third portion extending horizontally, wherein the fourth portion is connected to the first portion in the peripheral region, and the fifth portion is connected to the first and second portions in the peripheral region;
removing a portion of the first portion of the converted layer between the fourth portion and the fifth portion in the peripheral region;
removing the third portion of the converted layer in the cell region and the peripheral region to expose an inner portion of the first pattern remaining within the converted layer, thereby separating the fourth portion and the fifth portion in the peripheral region and separating the first portion and the second portion in the cell region, wherein the fourth portion of the peripheral region and the first portion of the cell region are connected by a single body, and the fifth portion of the peripheral region and the second portion of the cell region are connected by a single body;
removing the exposed inner portion of the first pattern to obtain second and third patterns of the second material, wherein the first pattern corresponds to the first and fourth portions, and the second pattern corresponds to the second and fifth portions; and
patterning the mask layer using the second and third patterns.

16. The method of claim 15, wherein the second and third patterns correspond to the first and second portions, respectively, of the converted layer.

17. The method of claim 16, wherein the first material includes photoresist.

18. The method of claim 17, wherein the second material includes oxide, the second and third patterns together comprising a pattern.

19. The method of claim 17, further comprising:
etching the semiconductor substrate using the patterned mask layer, wherein the mask layer is a hard mask layer.

20. The method of claim 17, wherein the converting step comprises:
coating a silylation reagent on the first pattern; and
baking the coated first pattern.

* * * * *